United States Patent [19]
Blish, II

[11] Patent Number: 6,021,074
[45] Date of Patent: Feb. 1, 2000

[54] DIRECT ACCESS TO RANDOM REDUNDANT LOGIC GATES BY USING MULTIPLE SHORT ADDRESSES

[75] Inventor: Richard C. Blish, II, Saratoga, Calif.

[73] Assignee: Advanced Micro Devices, Inc., Sunnyvale, Calif.

[21] Appl. No.: 09/148,684

[22] Filed: Sep. 4, 1998

[51] Int. Cl.[7] .................................................. G11C 7/00
[52] U.S. Cl. .............................................. 365/200; 365/201
[58] Field of Search ..................................... 365/200, 201, 365/189.02, 230.02

[56] References Cited

U.S. PATENT DOCUMENTS 5,701,270  12/1997  Rao ............................................ 365/200
5,719,879   2/1998  Gillis et al. ................................. 365/201

*Primary Examiner*—David Nelms
*Assistant Examiner*—Trong Phan
*Attorney, Agent, or Firm*—Sawyer & Associates

[57] ABSTRACT

The present invention provides a method for accessing a plurality of gates in a random logic structure. The method includes the steps of providing a first address for a first line coupled to a gate, providing a second address for a second line coupled to the gate, providing at least one additional address for at least one additional line coupled to the gate, and accessing the gate at the intersection of the first, second, and additional addresses. A method for accessing random logic gates which allows for the testing of more logic gates than conventional methods and which is also faster than conventional methods has been disclosed. The method of the present invention provides a three or more dimensional (segmented) address for each gate which allows for the status of more gates to be specifically ascertained. This allows for more ease in testing, saving valuable time. The method of the present invention also has the added advantage of allowing repair of defective gates with redundant gates.

30 Claims, 3 Drawing Sheets

DIRECT ACCESS TO RANDOM REDUNDANT LOGIC GATES BY USING MULTIPLE SHORT ADDRESSES

FIELD OF THE INVENTION

The present invention relates to random logic in a microprocessor, and more particularly to accessing gates in a random logic circuitry.

BACKGROUND OF THE INVENTION

As random logic circuitry for microprocessors become more complicated, so does the testing for defects of the circuitry's gates. FIG. 1 is a conceptual block diagram representing the structure of a conventional random logic circuitry. The conventional structure 100 comprises a lattice of logic gates, also called nodes, a sparse matrix. The dots in FIG. 1 represent gates while the lines represent connections between the gates. By analogy to RAM, certain gates could be connected through transfer gates to both a bit line 110 with a row address and a word line 120 with a column address. Assume that gate 140 resides at an intersection of a bit line 110 and a word line 120. This gate 140 can be accessed through its column address and row address. Conventionally, the column and row addresses are each n-bit (n=10 for 1 million gates). Only gates at intersections of bit and word lines can be specifically accessed through row address decoders 150 and column address decoders 160 which decode the row and column addresses, respectively. This conventional architecture of random logic circuitry 100 is well known in the art and will not be further described here.

This architecture presents a problem when testing the random logic circuitry for defective gates. Tests are performed using test codes, which use vectors designed to exercise certain gates. Using this test code, test data are loaded into a data array, and a test calculation or function is performed. The testing of the gates residing at the intersections is simple since gate status may be specifically accessed, and whether the status is correct can be quickly determined. However, with gates not at the intersection of bit and word lines, the status cannot be directly ascertained, so in order to determine if a defect existed, the actual result of the calculation or function must be compared with the correct result. If the actual result does not match the correct result, then one or more of the gates exercised is defective. Then, in conjunction with other tests, the defective gates hopefully can be isolated. If so, and redundant gates exist and are accessible, then these defective gates can be avoided in future calculations and functions. Ideally, the test code would exercise every gate in the random logic circuitry 100, however, this ideal is difficult if not impossible to attain due to the large number of gates and the complexity of the structure. Even with the most skilled code writer(s) and tens of millions of test vectors, perhaps 50%–90% coverage of the gates is typically achieved. This type of testing is very costly since writing test code takes considerable time.

Another way to test the random logic gates is to use a shift register. In this method, transfer gates are placed at each internal node of which one wishes to know the status. These transfer gates are strung together and connected to the shift register. A test data array is loaded, and a test calculation or function is performed. The shift register is then clocked to draw out the status of the nodes with the transfer gates. Each clock cycle draws one bit, or the status of one node. The status of the shift register is then compared with what the status of the nodes should be, thus defective gates can be found. With this method, each gate may be tested if a transfer gate is placed at every node. However, the disadvantage of using shift registers is the time required to draw out the status of the nodes. Because the size of conventional random logic circuitry is very large, the shift registers must also be very large. Thus, many clock pulses are required to draw out the status of all of the nodes, making this method time costly as well.

Accordingly, there exists a need for a method for accessing random logic gates which allows for the testing of more logic gates than conventional methods and which is also faster than conventional methods. The present invention addresses such a need.

SUMMARY OF THE INVENTION

The present invention provides a method for accessing a plurality of gates in a random logic structure. The method includes the steps of providing a first address for a first line coupled to a gate, providing a second address for a second line coupled to the gate, providing at least one additional address for at least one additional line coupled to the gate, and accessing the gate at the intersection of the first, second, and additional addresses. A method for accessing random logic gates which allows for the testing of more logic gates than conventional methods and which is also faster than conventional methods has been disclosed. The method of the present invention provides a three or more dimensional address for each gate which allows for the status of more gates to be specifically ascertained. This allows for more ease in testing, saving valuable time. The method of the present invention also has the added advantage of allowing repair of defective gates with redundant gates.

DETAILED DESCRIPTION

The present invention provides a method of accessing random logic gates which allows for the testing of more logic gates than conventional methods and which is also faster than conventional methods. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 2 and 3 in conjunction with the discussion below.

The method according to the present invention provides for the testing of more of the logic gates in a random logic circuitry by adding at least one dimension to the address of the gates. In a random logic circuitry in accordance with the present invention, every $2^{nth}$ gate is connected to a first line 110 and a second line 120. In a preferred embodiment, the first line 111 is one of $2^n$ bit lines with a row address, and the second line is one of $2^n$ word lines 120 with a column address. In this preferred embodiment (8 bits), every 256$^{th}$ gate is connected to a unique bit and word line with each row and column address combination identifying a particular 256×256 number of gates 220 (64 k).

Figure 1:
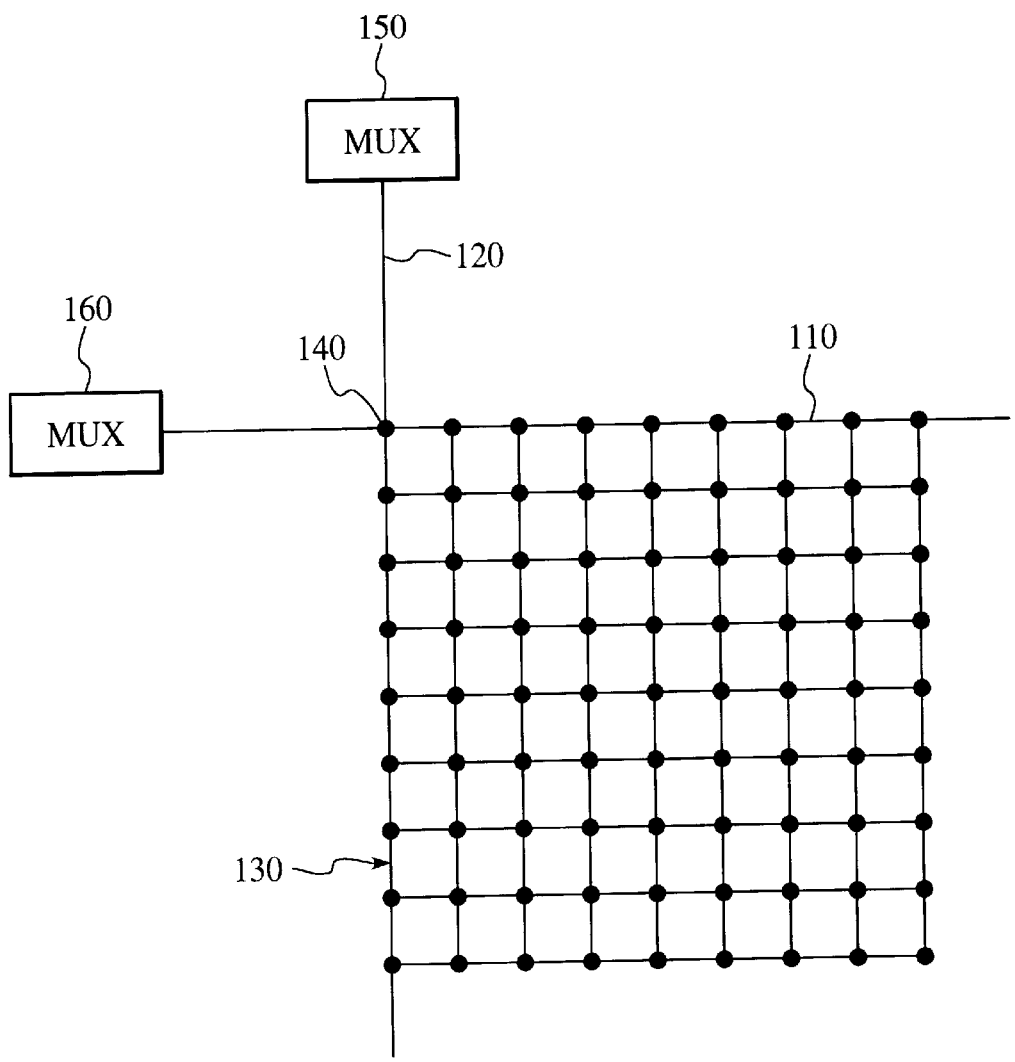
FIG. 1 is a conceptual block diagram of the structure of a conventional random logic circuitry.
Figure 2:
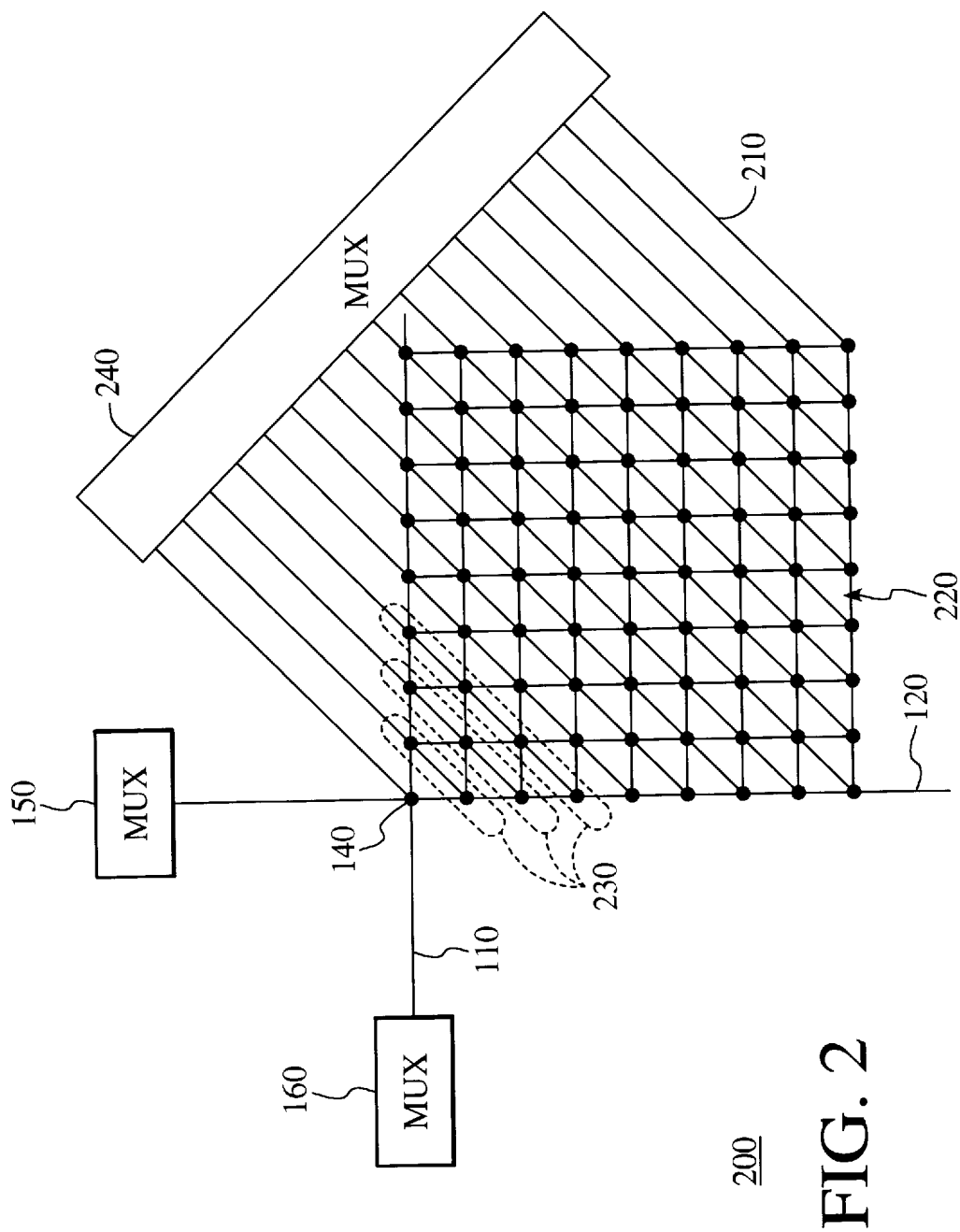
FIG. 2 illustrates a first preferred embodiment of a random logic circuitry in accordance with the present invention.

FIG. 2 illustrates a first preferred embodiment of the random logic circuitry 200 of the method in accordance with the present invention. In this first embodiment, the method of the present invention adds a third dimension to the gate addresses. This is accomplished through the addition of $2^n$ third lines, block lines 210, to the random logic circuitry 200. Each gate is connected to a block line 210 through an additional pass transistor (not shown). In this first embodiment, assuming that the bit line 110 is at 0 degrees and the word line 120 is at 90 degrees, the block lines 210 are at a 45 degree orientation in relation to the bit and word lines 110 and 120. These block lines 210 divide the gates 220 into "blocks" 230 of gates. In this first preferred embodiment, the block lines 210 may be addressed through an 8-bit block address which is decoded by a block address decoder 240 which functions in the same manner as row and column address decoders described above. Blocks of gates can thus be accessed through a three-dimensional address comprising, preferably, an 8-bit row address, an 8-bit column address, and an 8-bit block address, so 24 bits can address 16 million gates. With a three-dimensional address, more gates reside at intersections than with the conventional random logic structure 100, due to the longer address, although at the cost of more transfer gates. The status of more gates may be directly ascertained. Thus, test vectors for testing these gates by direct addressing are simpler to write than for the conventional random logic structure 100. The end result is a higher number of tested gates, and the time cost of testing is decreased.

Figure 3:
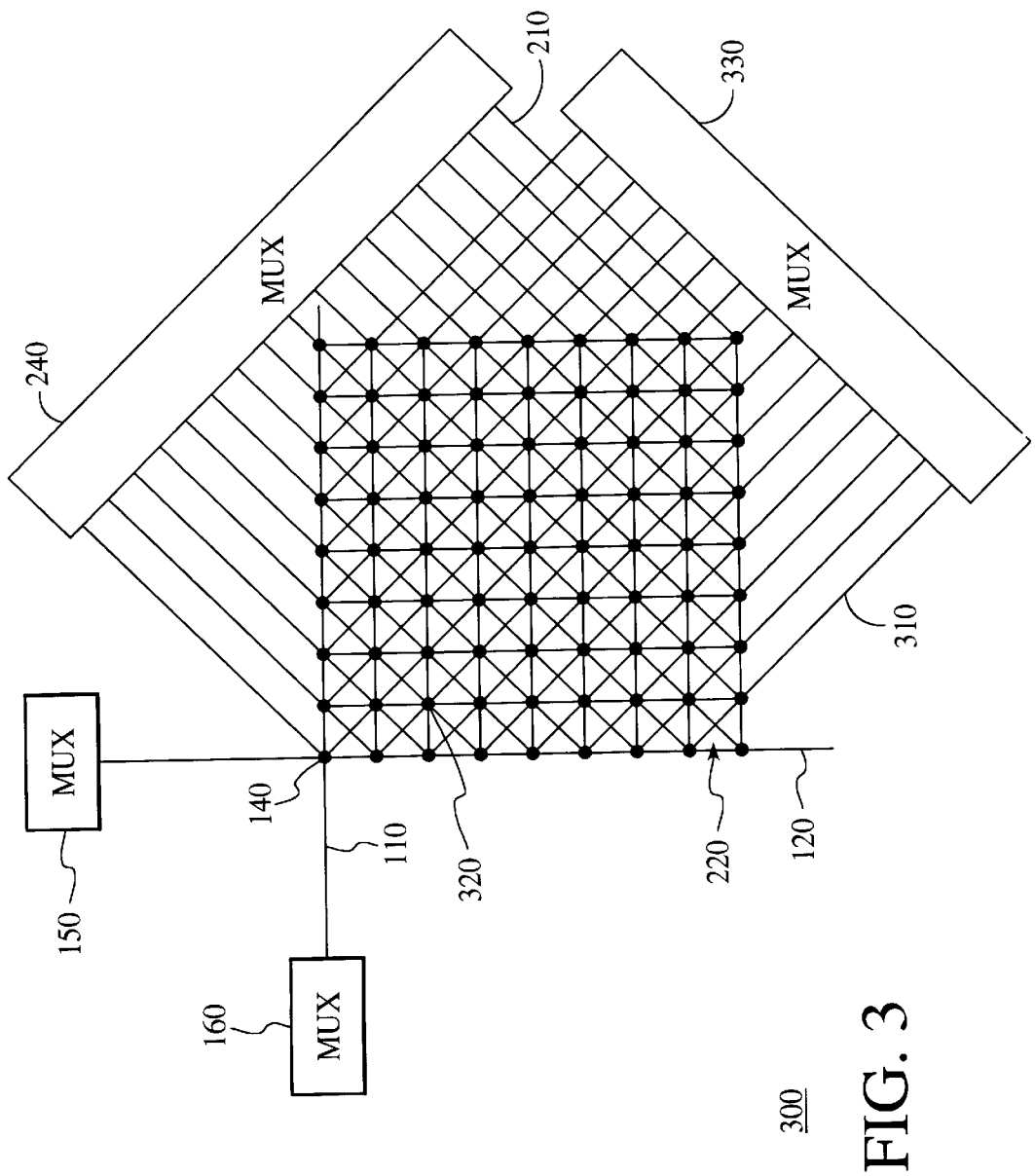
FIG. 3 illustrates a second preferred embodiment of a random logic circuitry in accordance with the present invention.

FIG. 3 illustrates a second preferred embodiment of the method in accordance with the present invention. This second embodiment expands upon the first embodiment by adding a fourth dimension to the address of the gates 220. This is accomplished through the addition of $2^n$ fourth lines, sub-block lines 310, to the gates 220 through a second additional pass transistor (not shown) to each gate. In this second embodiment, sub-block lines 210 are at a 135 degrees orientation in relation to the bit line 110 and the word line 120. These sub-block lines 310 divide the blocks 230 of gates further into sub-blocks 320, each sub-block containing a single gate. In this second embodiment, the sub-block lines are addressed through, preferably, an 8-bit sub-block address which is decoded by a sub-block address decoder 330 which functions in the same manner as row, column, and block address decoders described above. Each gate can thus be specifically accessed through a four-dimensional (segmented) address comprising, preferably, an 8-bit row address, an 8-bit column address, an 8-bit block address, and an 8-bit sub-block address, i.e., a 32-bit address (4 billion sites). In this embodiment, each gate in the random logic 300 resides at an intersection of a bit line, a word line, a block line, and a sub-block line. Since each gate can be specifically accessed, a systematic approach for ascertaining the status of each gate may be used. The test vectors for testing these gates can thus be even simpler than with the first preferred embodiment. Defects can be detected quickly, saving valuable time. With this embodiment, every gate in the random logic 300 can be tested (for wiggle but not for speed), and a larger number of defects can be found, making the random logic 300 more reliable.

The preferred embodiments of the present invention have been described with 8-bit addresses because with such short addresses, the problems experienced with the conventional long shift registers are avoided (a typical organization could be, for example, 16 shift registers, each of the shift registers being 256 k long ("touches" 4 million nodes) so that it requires 256 k clocks to learn full status for one set of vectors). The status of each gate at the addresses can be ascertained more quickly (1 clock per gate). However, one of ordinary skill in the art will understand that other address sizes may be used without departing from the spirit and scope of the present invention.

Although the present invention has been described with three and four dimensional addresses, one of ordinary skill in the art will understand that more dimensions (segments) can be added to the address without departing from the spirit and scope of the present invention. The degree orientation of the lines would change in accordance with the number of lines added. With more lines, addresses shorter than eight bits may be used. For example, assume a fifth dimension is added to the address with a fifth line. The bit line 110 would remain at 0 degrees, and the word line would remain at 90 degrees. With three additional lines, these lines would be equally spaced at 120 degrees apart but rotated 15 degrees from the bit and word lines so that none of the lines are parallel. The lines would be at 0, 15, 90, 135, and 255 degrees.

The method of the present invention provides an additional advantage. Since testing of the gates is more thorough and faster, redundant gates may be placed on the same die as the random logic circuitry 300. When a defective gate is found, the defect may be repaired by wiring a redundant gate to the random logic circuitry in lieu of the defective gate.

A method for accessing random logic gates which allows for the testing of more logic gates than conventional methods and which is also faster than conventional methods has been disclosed. The method of the present invention provides a three or more dimensional address for each gate which allows for the status of more gates to be specifically ascertained. This allows for more ease in testing, saving valuable time. The method of the present invention also has the added advantage of allowing repair of defective gates with redundant gates.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for accessing a plurality of gates in a random logic structure, comprising the steps of:

(a) providing a first address for a first line coupled to a gate;

(b) providing a second address for a second line coupled to the gate;

(c) providing at least one additional address for at least one additional line coupled to the gate; and (d) accessing the gate at the intersection of the first, second, and the at least one additional address.

2. The method of claim 1, wherein the first address is a row address for a bit line.

3. The method of claim 1, wherein the second address is a column address for a word line.

4. The method of claim 1, wherein the additional address comprises a block address for a block line.

5. The method of claim 4, wherein the additional address further comprises a sub-block address for a sub-block line.

6. A system for accessing a plurality of gates in a random logic structure, comprising:
   means for providing a first address for a first line coupled to a gate;
   means for providing a second address for a second line coupled to the gate;
   means for providing at least one additional address for at least one additional line coupled to the gate; and
   means for accessing the gate at the intersection of the first, second, and the least one additional address.

7. The system of claim 6, wherein the first address is a row address for a bit line.

8. The system of claim 6, wherein the second address is a column address for a word line.

9. The system of claim 6, wherein the additional address comprises a block address for a block line.

10. The system of claim 9, wherein the additional address further comprises a sub-block address for a sub-block line.

11. A random logic structure, the structure including a plurality of gates, comprising:
    (a) a first line with a first address coupled to a gate;
    (b) a second line with a second address coupled to the gate; and
    (c) at least one additional line with at least one additional address coupled to the gate, wherein the gate can be accessed at the intersection of the first, second, and the at least one additional address.

12. The random logic structure of claim 11, wherein the first line is a bit line with a row address.

13. The random logic structure of claim 11, wherein the second line is a word line with a column address.

14. The random logic structure of claim 11, wherein the additional line comprises a block line with a block address.

15. The random logic structure of claim 11, wherein the additional line further comprises a sub-block line with a sub-block address.

16. A method for accessing a plurality of gates in a random logic structure, comprising the steps of:
    (a) providing a row address for a bit line coupled to a gate;
    (b) providing a column address for a word line coupled to the gate;
    (c) providing a block address for a block line coupled to the gate; and
    (d) accessing the gate at the intersection of the row, column, and block addresses.

17. The method of claim 16, wherein the block line is at a 45 degree orientation in relation to the bit and word lines.

18. A system for accessing a plurality of gates in a random logic structure, comprising:
    means for providing a row address for a bit line coupled to a gate;
    means for providing a column address for a word line coupled to the gate;
    means for providing a block address for a block line coupled to the gate; and
    means for accessing the gate at the intersection of the row, column, and block addresses.

19. The system of claim 18, wherein the block line is at a 45 degree orientation in relation to the bit and the word lines.

20. A random logic structure, the structure including a plurality of gates, comprising:
    a bit line with a row address coupled to a gate;
    a word line with a column address coupled to the gate; and
    a block line with a block address coupled to the gate, wherein the gate can be accessed at the intersection of the row, column, and block addresses.

21. The random logic structure of claim 20, wherein the block line is at a 45 degree orientation in relation to the bit and word lines.

22. A method for accessing a plurality of gates in a random logic structure, comprising the steps of:
    (a) providing a row address for a bit line coupled to a gate;
    (b) providing a column address for a word line coupled to the gate;
    (c) providing a block address for a block line coupled to the gate;
    (d) providing a sub-block address for a sub-block line coupled to the gate; and
    (d) accessing the gate at the intersection of the row, column, block, and sub-block addresses.

23. The method of claim 22, wherein the block line is at a 45 degree orientation in relation to the bit and word lines.

24. The method of claim 22, wherein the sub-block line is at a 135 degree orientation in relation to the bit and word lines.

25. A system for accessing a plurality of gates in a random logic structure, comprising:
    means for providing a row address for a bit line coupled to a gate;
    means for providing a column address for a word line coupled to the gate;
    means for providing a block address for a block line coupled to the gate;
    means for providing a sub-block address for a sub-block line coupled to the gate; and
    means for accessing the gate at the intersection of the row, column, block, and sub-block addresses.

26. The system of claim 25, wherein the block line is at a 45 degree orientation in relation to the bit and word lines.

27. The method of claim 25, wherein the sub-block line is at a 135 degree orientation in relation to the bit and word lines.

28. A random logic structure, the structure including a plurality of gates, comprising:
    (a) a bit line with a bit address coupled to a gate;
    (b) a word line with a column address coupled to the gate;
    (c) a block line with a block address coupled to the gate; and
    (d) a sub-block line with a sub-block address coupled to the gate, wherein the gate can be accessed at the intersection of the bit, column, block, and sub-block addresses.

29. The random logic structure of claim 28, wherein the block line is at a 45 degree orientation in relation to the bit and word lines.

30. The random logic structure of claim 28, wherein the sub-block line is at a 135 degree orientation in relation to the bit and word lines.

* * * * *